(12) United States Patent
Griffing et al.

(10) Patent No.: US 11,434,753 B2
(45) Date of Patent: Sep. 6, 2022

(54) FARADAY SHIELD

(71) Applicant: HALLIBURTON ENERGY SERVICES, INC., Houston, TX (US)

(72) Inventors: Matthew Chase Griffing, Kingwood, TX (US); Anand Prakash, Tomball, TX (US)

(73) Assignee: Halliburton Energy Services, Inc., Houston, TX (US)

(*) Notice: Subject to any disclaimer, the term of this patent is extended or adjusted under 35 U.S.C. 154(b) by 429 days.

(21) Appl. No.: 16/600,970

(22) Filed: Oct. 14, 2019

(65) Prior Publication Data
US 2021/0111487 A1 Apr. 15, 2021

(51) Int. Cl.
*E21B 47/13* (2012.01)
*H01Q 1/52* (2006.01)
*H05K 9/00* (2006.01)

(52) U.S. Cl.
CPC ............ *E21B 47/13* (2020.05); *H01Q 1/526* (2013.01); *H05K 9/0049* (2013.01)

(58) Field of Classification Search
CPC ........ E21B 47/13; E21B 47/01; E21B 47/017; H01Q 1/526; H05K 9/0049
See application file for complete search history.

(56) References Cited

U.S. PATENT DOCUMENTS

| | | |
|---|---|---|
| 2005/0189946 A1 | 9/2005 | Moore |
| 2006/0204997 A1* | 9/2006 | Macioszek ............ G01N 35/026 435/6.15 |
| 2008/0290873 A1 | 11/2008 | Homan et al. |
| 2011/0316542 A1 | 12/2011 | Frey et al. |
| 2012/0250461 A1 | 10/2012 | Millot et al. |
| 2017/0227670 A1* | 8/2017 | Vehra ...................... E21B 47/12 |
| 2018/0003039 A1* | 1/2018 | Nguyen .................. E21B 47/13 |
| 2018/0017700 A1* | 1/2018 | Shin ........................ E21B 49/08 |
| 2019/0360322 A1* | 11/2019 | Bloemenkamp ......... G01V 3/20 |

FOREIGN PATENT DOCUMENTS

EP 0903591 B1 6/2003

OTHER PUBLICATIONS

International Search Report, Response and Written Opinion, PCT Application No. PCT/US209/056337, dated Jul. 13, 2020.

* cited by examiner

*Primary Examiner* — Brad Harcourt
(74) *Attorney, Agent, or Firm* — Polsinelli PC

(57) ABSTRACT

An electronics carrier to be disposed in a downhole tool is provided. The electronics carrier includes a chassis, and a receiver processing component disposed on the chassis. The receiver processing component is communicatively coupled to one or more receiver sensors, and the receiver processing component includes a receiver pre-amplifier. A transmitter processing component is disposed on the chassis. The transmitter processing component is communicatively coupled to one or more transmitter sensors. A shield is disposed on the chassis to prevent cross-talk between the transmitter processing component and the receiver processing component.

15 Claims, 14 Drawing Sheets

FARADAY SHIELD

FIELD

The present disclosure relates generally to electromagnetic shield in downhole tools.

BACKGROUND

Wellbores are drilled into the earth for a variety of purposes including accessing hydrocarbon bearing formations. A variety of downhole tools may be used within a wellbore in connection with accessing and extracting such hydrocarbons. The downhole tools may require instructions and/or may need to pass along data obtained by the downhole tools. Sensors are connected to electronic components, such as processing components, to transmit and receive data.

BRIEF DESCRIPTION OF THE DRAWINGS

Implementations of the present technology will now be described, by way of example only, with reference to the attached figures, wherein.

DETAILED DESCRIPTION

Figure 1:
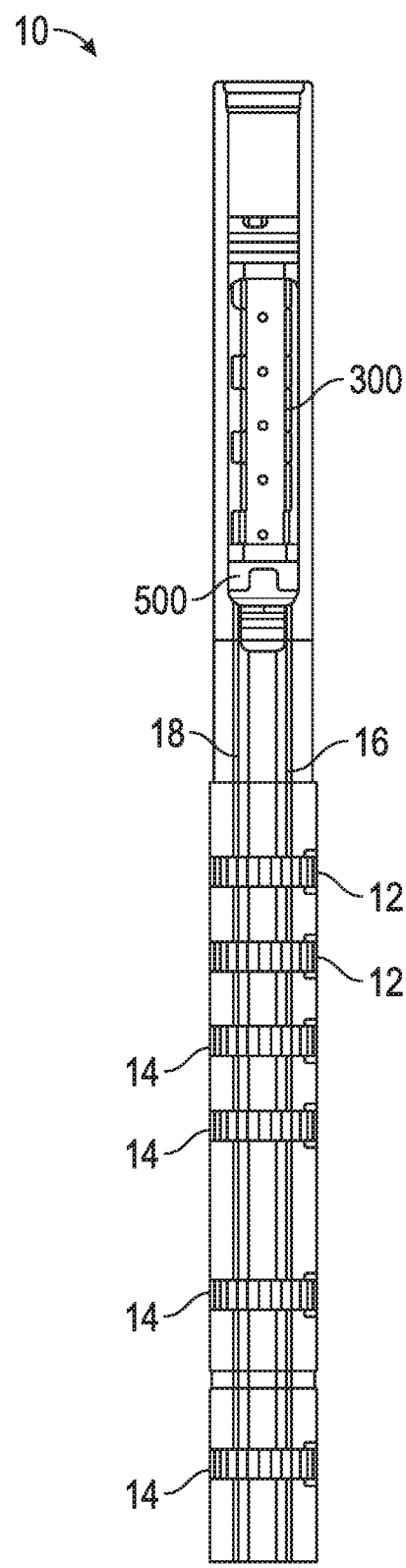
FIG. 1 is a diagram illustrating a downhole tool according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the examples described herein. However, it will be understood by those of ordinary skill in the art that the examples described herein can be practiced without these specific details. In other instances, methods, procedures and components have not been described in detail so as not to obscure the related relevant feature being described. Also, the description is not to be considered as limiting the scope of the examples described herein. The drawings are not necessarily to scale and the proportions of certain parts may be exaggerated to better illustrate details and features of the present disclosure.

An electromagnetic shield for use in a transmitter and receiver based tool can include any or all of the following features or aspects. The transmitter and receiver based tool may be a downhole tool that includes, for example, downhole sensors, chokes, and valves. The chokes and valves may include actuatable flow regulation devices, such as variable chokes and valves, and may be used to regulate the flow of the fluids into and/or out of the conveyance. Additionally, data captured by the downhole sensors may be transmitted uphole. As such, the transmitter and receiver based tools may receive signals from a surface location for instructions on operation based on these signals, and may transmit signals to a surface location for analysis or to determine the next operation.

The transmitter and receiver based tool has transmitter electronics and receiver electronics, with the transmitter electronics and receiver electronics residing in one downhole tool. For example, the transmitter electronics and the receiver electronics can include processing components which communicate and/or process data. In at least one example, the transmitter electronics and the receiver electronics may reside on one electronics carrier. When the transmitter electronics and receiver electronics are placed in close proximity, for example when the transmitter electronics and receiver electronics are on a single electronics carrier, the transmitter signals and the receiver signals may be coupled in an unwanted manner. The unwanted coupling is known as cross-talk between the transmitter signals and the receiver signals, and may lead to undesired behavior such as measurement offset and/or errors.

In at least one example, the transmitter electronics has significantly greater voltage and larger current passing through it compared to the receiver electronics. The strong transmitter signals may couple to the nearby receiver electronics through an unintended path in the electronics chassis of the electronics carrier. The weaker receiver signals are then undesirably affected by the transmitter signals. In this example of crosstalk, the transmitter electronics is the Aggressor and the receiver electronics is the Victim. Accordingly, the present disclosure provided reduces or eliminates the cross-talk between receiver and transmitter signals in downhole tools.

FIG. 1 is a diagram illustrating a downhole tool 10 including an electronics carrier 300 according to the present disclosure. As shown, a connector ring 500 acts as an interface between the electronics carrier 300 and the transmitter sensors 14 and receiver sensors 12. With the connector ring 500 as disclosed herein, a downhole tool 10 may use a singular connector ring 500 for both transmitter and receiver signals. Additionally, the processing components for the transmitter and receiver signals (shown, for example, in FIG. 2A) can both be disposed on the electronics carrier 300. As illustrated in FIG. 1, a first end of the connector ring 500 connects to one or more receiver sensors 302 with receiver sensor cables 306, and to one or more transmitter sensors 304 with transmitter sensor cables 308. In some examples, the connector ring 500 can directly couple to the sensors 302 and 304 without the use of receiver and transmitter sensor cables 306 and 308. A second end of the connector ring 500 can be coupled to the electronics carrier 300. Accordingly, the electronics carrier 300 can process, transmit, and receive signals to and from the receiver sensors 12 and/or the transmitter sensors 14. While FIG. 1 illustrates four transmitter sensors 14 and two receiver sensors 12, any number such as one, two, three, or more of transmitter sensors 14 and receiver sensors 12 can be utilized.

Figure 2A:
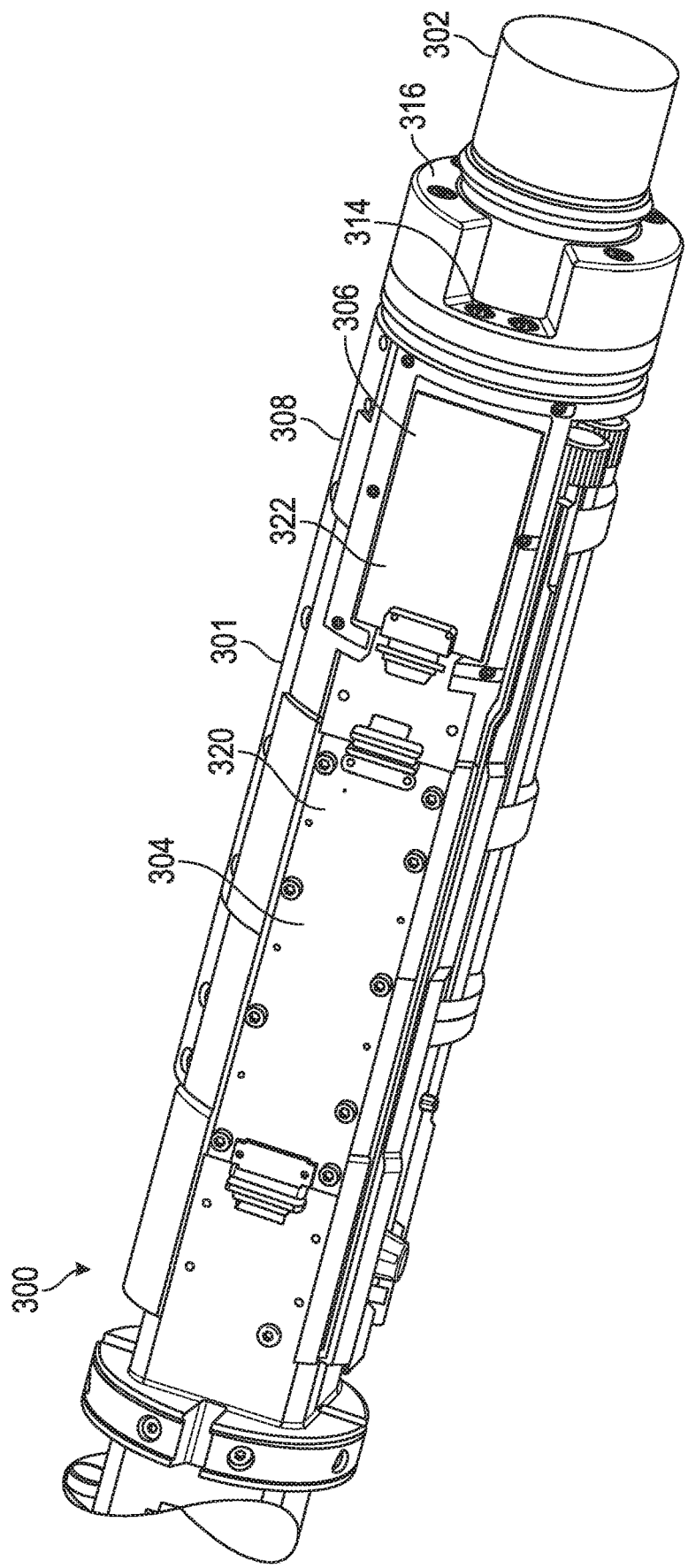
FIG. 2A is a diagram illustrating an exemplary electronics carrier with uncovered processing components.

FIG. 2A illustrates an example electronics carrier 300 with electromagnetic shields removed so as to show its interior components. The electronics carrier 300 has a connecting portion 302 that is used to couple the electronics carrier 300 with a respective connector ring. In at least one example, as illustrated in FIG. 2A, the electronics carrier 300 has a receiver processing component 304 which includes a receiver pre-amplifier 306. The receiver processing component 304 can be communicatively coupled with one or more receiver sensors, and the receiver processing component 304 receives, transmits, and/or processes data received from the receiver sensors. The receiver pre-amplifier 306 converts a weak electrical incoming receiver signal into a stronger output signal for further signal conditioning and/or processing. The electronics carrier 300 also includes transmitter processing component 308. The transmitter processing component 308 can be communicatively coupled with one or more transmitter sensors. The transmitter processing component 308 can receive, transmit, and/or process data to be transmitted out by the transmitter sensors. In the example shown in FIG. 2A, the transmitter processing component 308 is placed adjacent to the receiver processing component 304 and the receiver pre-amplifier 306 on the electronics carrier chassis 301.

Figure 2B:
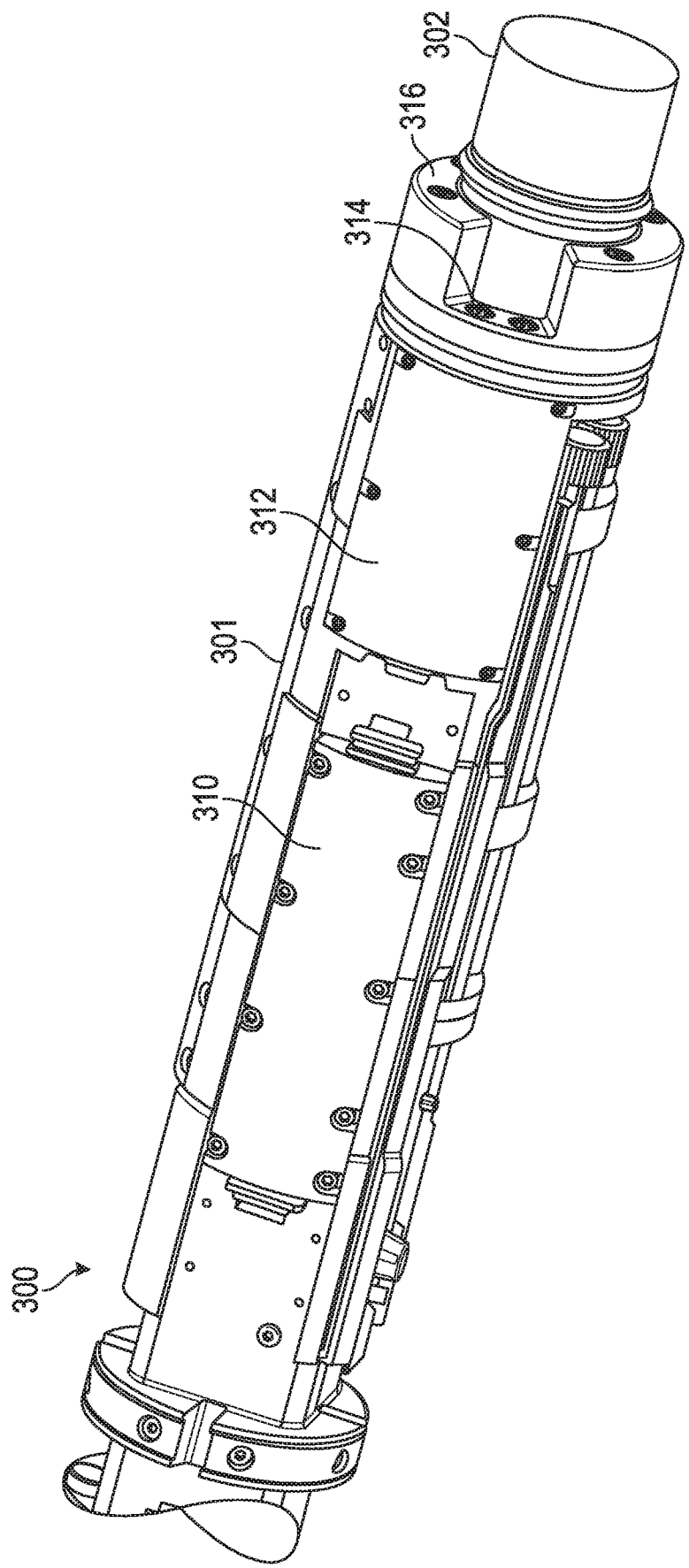
FIG. 2B is a diagram illustrating an electronics carrier with covered processing components according to the present disclosure.

In some examples, as illustrated in FIG. 2A, the receiver processing component 304, the receiver pre-amplifier 306, and the transmitter processing component 308 are placed in cavities 320 and 322, respectively in the electronics carrier chassis 301. In such examples, electromagnetic shields 310, 312 are placed over the cavities in the electronics carrier chassis 301. FIG. 2B shows an example of how electromagnetic shields 310, 312 are used to cover the electronics processing component 304 and/or receiver pre-amplifier 306, respectively, to prevent the effect of cross-talk. As shown, the shields 310, 312 can also cover and enclose either or both of the cavities 320 and 322 in which the electronics processing component 304 and receiver pre-amplifier 306 are placed.

Although illustrated in cavities in FIGS. 2A and 2B, in other examples, the receiver processing component 304, the receiver pre-amplifier 306, and the transmitter processing component 308 may protrude from the electronics carrier chassis 301.

In at least one example, electromagnetic shields 310, 312 may surround the receiver processing component 304 and/or the receiver pre-amplifier 306, respectively, in a cage-like manner. The electromagnetic shields 310, 312 may be constructed using aluminum, copper, or any other conductive materials. In at least one example, the electromagnetic shields 310, 312 can be at least as thick as one skin depth of the lowest frequency emitted by transmitter electronics board 308. In other examples, if space permits, the electromagnetic shields 310, 312 can have a thickness of 2 or 3 skin depths. In yet other examples, the thickness of the electromagnetic shields 310, 312 can be any desired thickness.

In some examples, the electromagnetic shields 310, 312 may be solid to maximize shielding against undesired electromagnetic signals.

In some examples, the electromagnetic shields 310, 312 may have perforations, the perforations being smaller in dimension than the wavelength of the highest frequency emitted by transmitter processing component 308. In at least one example, the perforations can be significantly smaller in dimension than the wavelength of the highest frequency emitted by transmitter processing component 308.

In some examples, the electromagnetic shields 310, 312 may include wire meshes that are able to conform to the geometry of the space. In such examples, the spacing between each two adjacent wire in the wire mesh is smaller, and in some cases significantly smaller, in dimension than the wavelength of the highest frequency emitted by the transmitter processing component 308.

Figure 2C:
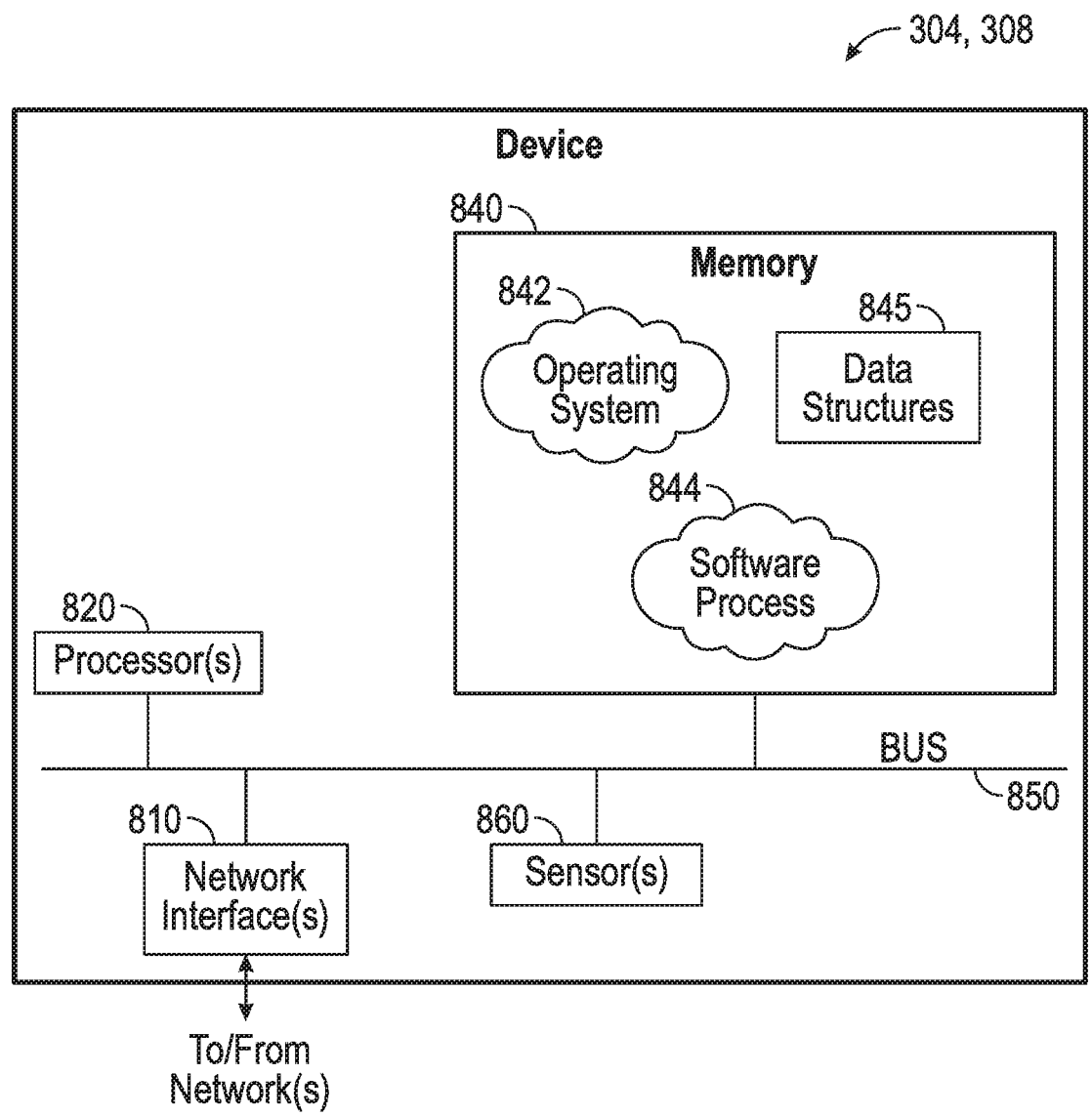
FIG. 2C is a diagram of an exemplary processing component according to the present disclosure.

FIG. 2C is a block diagram of an exemplary processing component, for example transmitter processing component 308 and/or receiver processing component 304. Processing components 304, 308 are configured to perform processing of data and communicate with one or more of the components discussed herein and may also be configured to communication with remote devices/systems.

As shown in FIG. 2C, processing components 304, 308 can include hardware and software components such as network interfaces 810, at least one processor 820, sensors 860 and a memory 840 interconnected by a system bus 850. Network interface(s) 810 can include mechanical, electrical, and signaling circuitry for communicating data over communication links, which may include wired or wireless communication links. Network interfaces 810 are configured to transmit and/or receive data using a variety of different communication protocols, as will be understood by those skilled in the art.

Processor 820 represents a digital signal processor (e.g., a microprocessor, a microcontroller, or a fixed-logic processor, etc.) configured to execute instructions or logic to perform tasks in a wellbore environment. Processor 820 may include a general purpose processor, special-purpose processor (where software instructions are incorporated into the processor), a state machine, application specific integrated circuit (ASIC), a programmable gate array (PGA) including a field PGA, an individual component, a distributed group of processors, and the like. Processor 820 typically operates in conjunction with shared or dedicated hardware, including but not limited to, hardware capable of executing software and hardware. For example, processor 820 may include elements or logic adapted to execute software programs and manipulate data structures 845, which may reside in memory 840.

Sensors 860, which may include receiver sensors 12 and/or transmitter sensors 14 as disclosed herein, typically operate in conjunction with processor 820 to perform measurements, and can include special-purpose processors, detectors, transmitters, receivers, and the like. In this fashion, sensors 860 may include hardware/software for generating, transmitting, receiving, detection, logging, and/or sampling magnetic fields, seismic activity, and/or acoustic waves, temperature, pressure, radiation levels, casing collar locations, weights, torques, tool health (such as voltage levels and current monitors), accelerations, gravitational fields, strains, video recordings, flow rates, solids concentration, solids size, chemical composition, and/or other parameters.

Memory 840 comprises a plurality of storage locations that are addressable by processor 820 for storing software programs and data structures 845 associated with the embodiments described herein. An operating system 842, portions of which may be typically resident in memory 840 and executed by processor 820, functionally organizes the device by, inter alia, invoking operations in support of software processes and/or services 844 executing on processing systems 8001 and 801. These software processes and/or services 844 may perform processing of data and communication with processing systems 800 and 801, as described herein. Note that while process/service 844 is shown in centralized memory 840, some examples provide for these processes/services to be operated in a distributed computing network.

It will be apparent to those skilled in the art that other processor and memory types, including various computer-readable media, may be used to store and execute program instructions pertaining to the fluidic channel evaluation techniques described herein. Also, while the description illustrates various processes, it is expressly contemplated that various processes may be embodied as modules having portions of the process/service 844 encoded thereon. In this fashion, the program modules may be encoded in one or more tangible computer readable storage media for execution, such as with fixed logic or programmable logic (e.g., software/computer instructions executed by a processor, and any processor may be a programmable processor, programmable digital logic such as field programmable gate arrays or an ASIC that comprises fixed digital logic. In general, any process logic may be embodied in processor 820 or computer readable medium encoded with instructions for execution by processor 820 that, when executed by the processor, are operable to cause the processor to perform the functions described herein.

Figure 3:
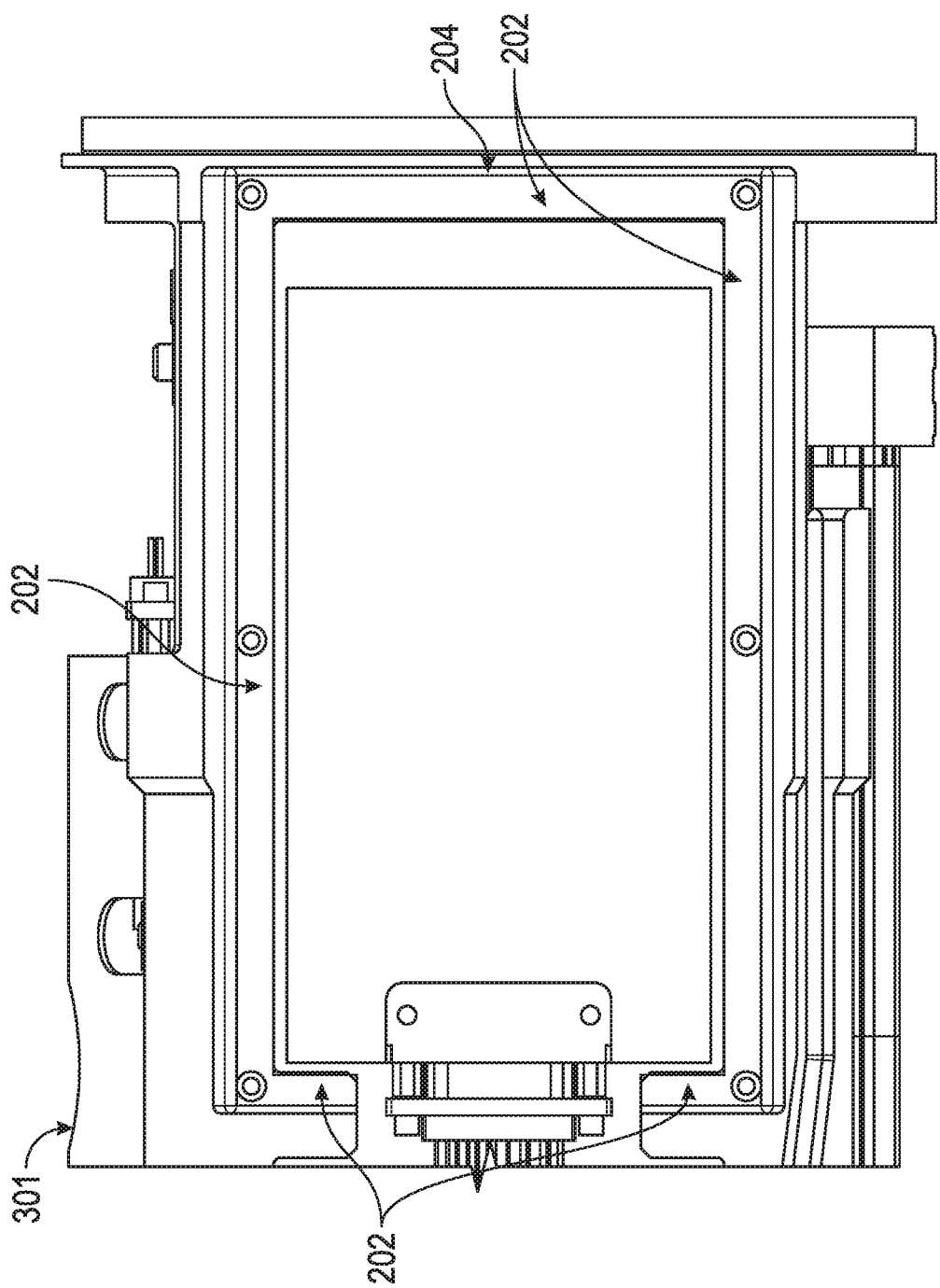
FIG. 3 is a diagram illustrating the use of a gasket on the edges of a cavity in an electronics carrier.

FIG. 3 is a diagram illustrating the use of a gasket 202 on the edges of a cavity 204 in the chassis 301 of the electronics carrier 300. In at least one example, a gasket 202 can be used to seal the junction between either of the electromagnetic shields 310, 312 and the electronics carrier chassis 301. The use of a gasket 202 is able to prevent electromagnetic waves from affecting the receiver signals from gaps in the junction between the electromagnetic shields 310, 312 and the electronics carrier chassis 301. The gasket may use aluminum, copper, beryllium copper, brass, stainless steel, or any other conductive material that is pliable enough to form a seal.

Figure 4:
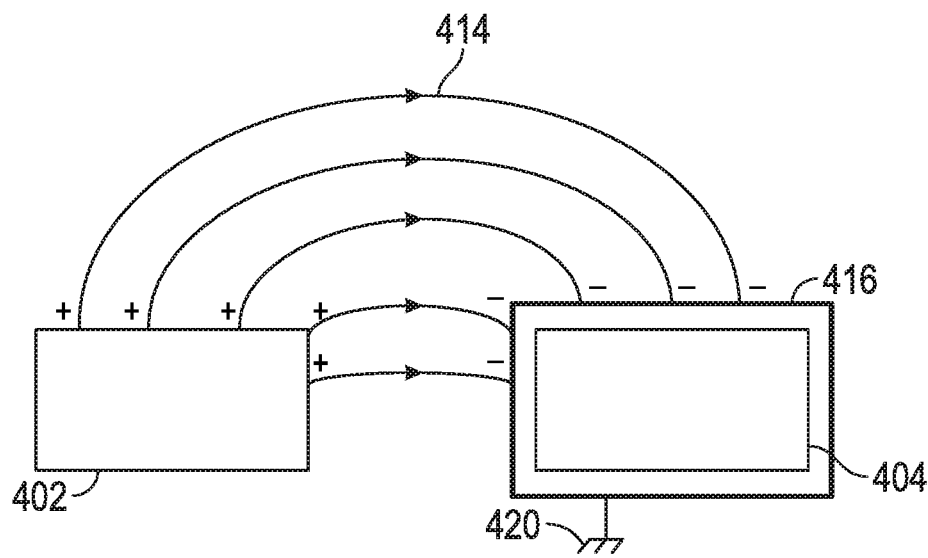
FIG. 4 is a diagram illustrating the use of a grounded electromagnetic shield to prevent crosstalk between transmitter and receiver processing components according to the present disclosure.

FIG. 4 illustrates the use of electromagnetic shield 416 to prevent crosstalk between transmitter processing component 402 and receiver processing component 404. Transmitter processing component 402 and receiver processing component 404 can be similar to the transmitter processing component 308 and the receiver processing component 304 discussed above. As shown in FIG. 4, the transmitter processing component 402 has a higher voltage than the receiver processing component 404. As a result, the transmitter processing component 402 generates stray electric fields 414 that may couple to the receiver processing component 404. When an electromagnetic shield 416 is placed around the receiver processing component 404 and connected to the electronics carrier chassis ground 420, the excess charge is drained to the chassis ground 420, and the receiver processing component 404 is shielded from the stray electric fields 414. The electromagnetic shield 416 may be constructed using aluminum, copper, or any other conductive materials.

The electromagnetic shield 416 is also able to shield the receiver processing component 404 from magnetic fields. The large current passing through the transmitter processing component 402 may generate magnetic fields that may induce cross-talk (or eddy) currents 414 directly in the receiver electronics 404 or induce currents 414 on the surface of the electronics carrier chassis 410 and/or on the inner diameter surface of the drill collar 408 that the electronics carrier is placed in. These circulating currents 414, such as eddy currents, can flow by or around the receiver processing component 404 and generate secondary magnetic fields that cross-talk to the receiver processing component 404.

Figure 5:
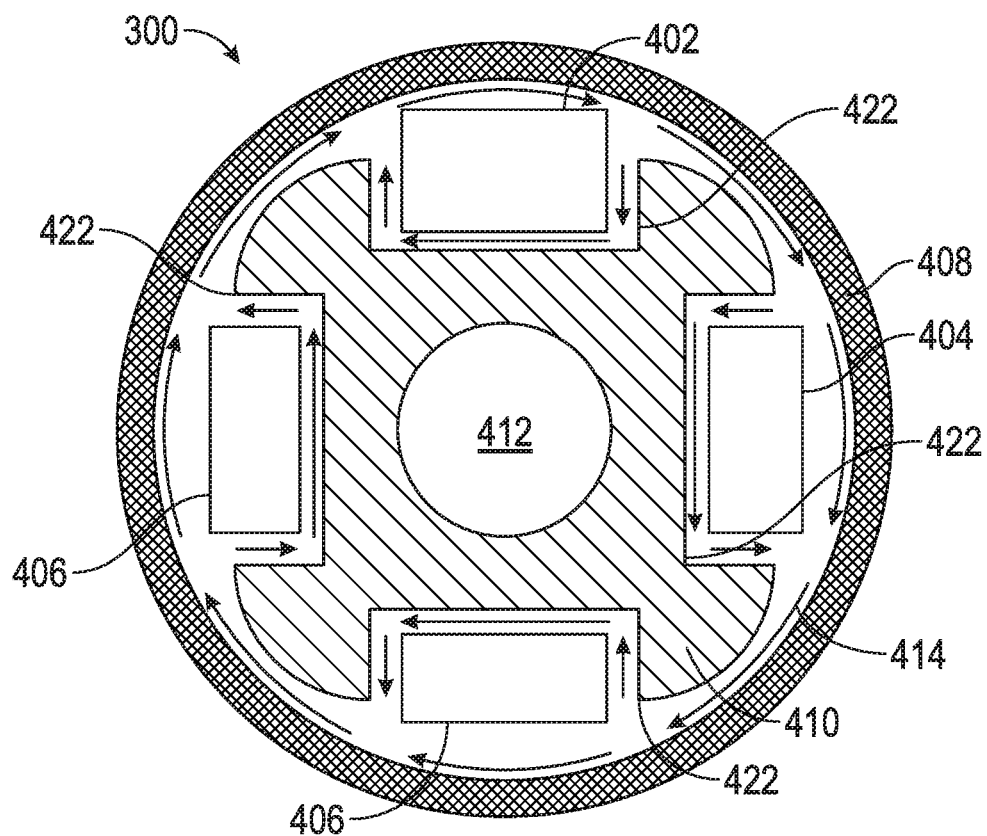
FIG. 5 is a diagram illustrating an electronics carrier chassis with transmitter and receiver processing components located adjacently.

FIG. 5 illustrates an example of the described effects in an electronics carrier chassis 410 with transmitter and receiver processing components located adjacently. As shown the electronics carrier has a carrier chassis 410 with four bays 422. Placed in two of the bays 422 are transmitter processing component 402 and receiver processing component 404. Miscellaneous electronics 406 are provided in two of the remaining bays 422. Furthermore, FIG. 5 illustrates a cross sectional overhead view of the currents 414. While the illustrated currents 414 are shown to be in the clockwise direction, the currents can flow or circulate in any direction, depending on the radiated magnetic field from the transmitter processing component 402.

Figure 6A:
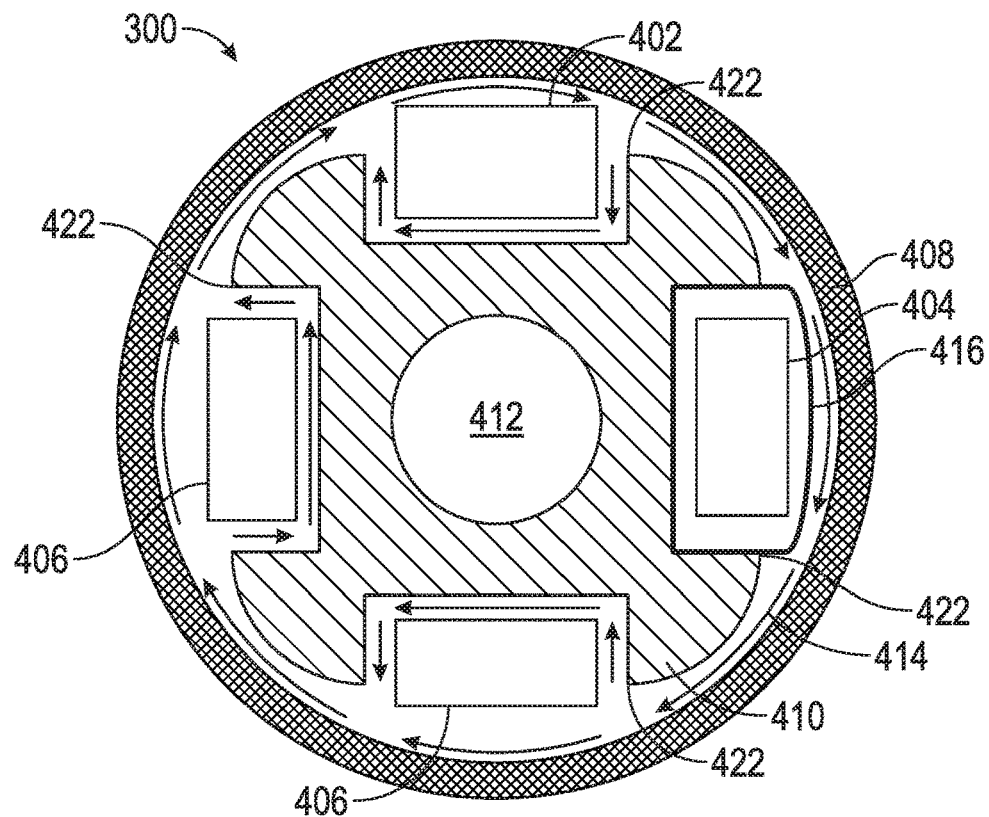
FIG. 6A is a diagram illustrating an electronics carrier chassis with a shield covering the receiver processing component according to the present disclosure.
Figure 6B:
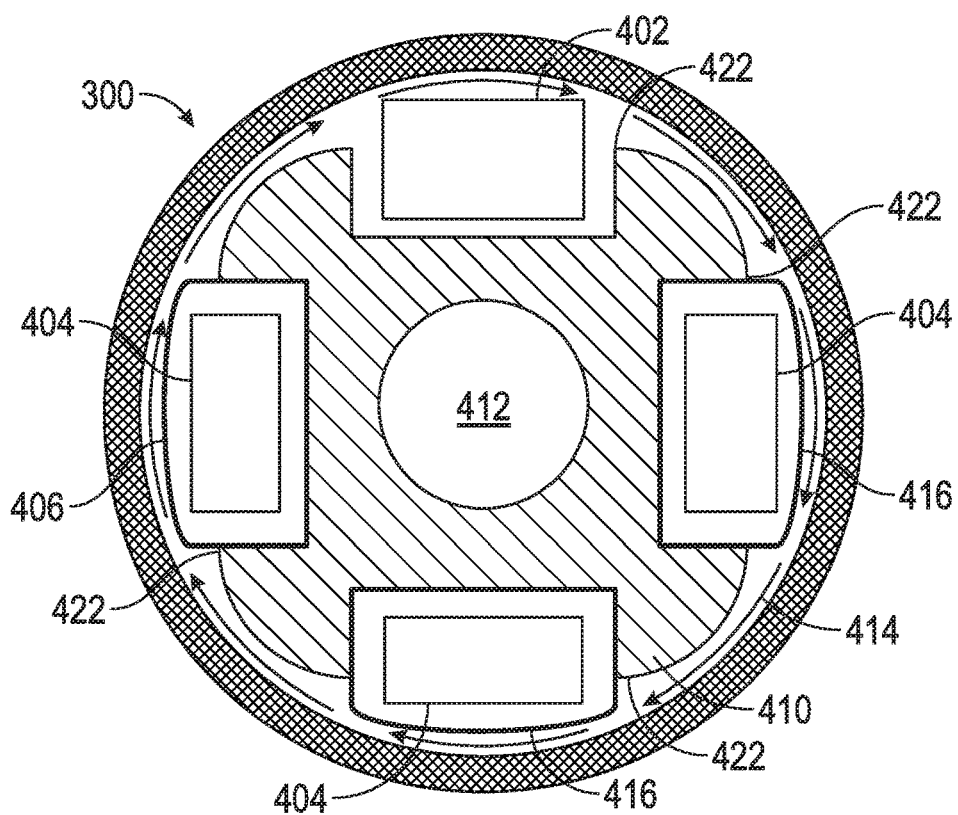
FIG. 6B is a diagram illustrating an electronics carrier chassis with multiple shields covering multiple receiver processing components according to the present disclosure.
Figure 6C:
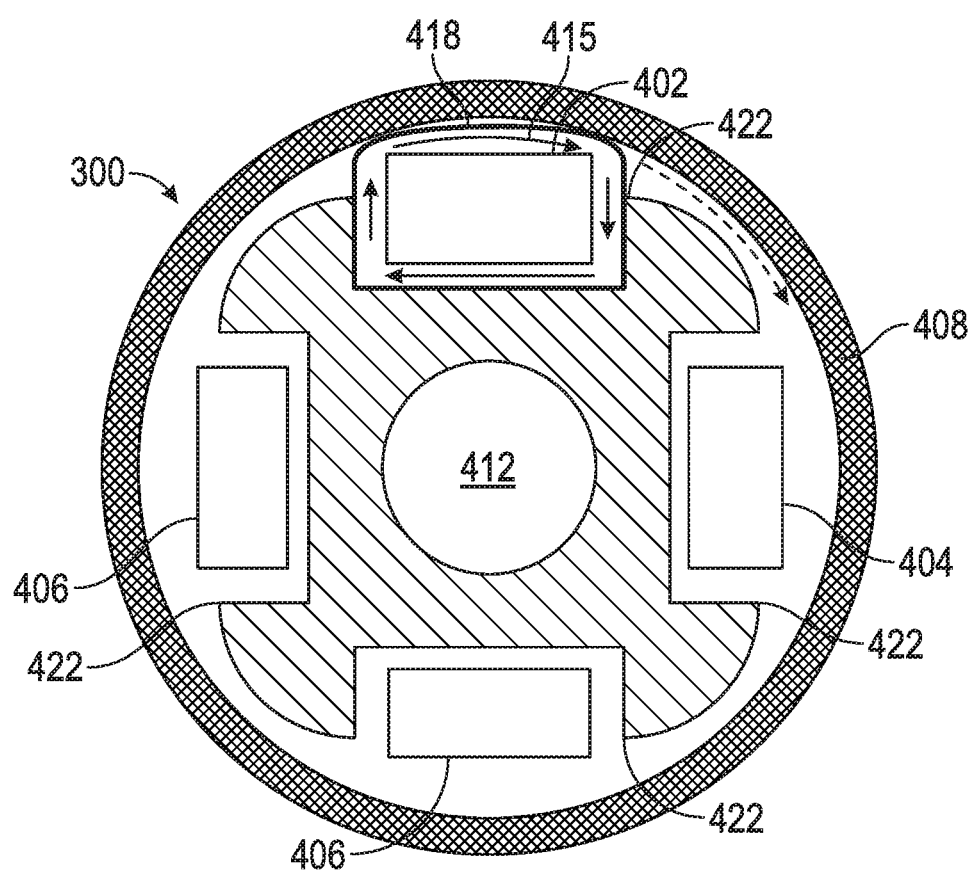
FIG. 6C is a diagram illustrating an electronics carrier chassis with a shield covering the transmitter processing components according to the present disclosure.

FIGS. 6A, 6B, and 6C illustrate example implementations of the concept shown in FIG. 3. In some examples, the electronics carrier includes a carrier chassis 410. The carrier chassis may have one or more bays 422 that the electronics are placed in. In the examples shown in FIGS. 5, 6A, 6B, and 6C, the carrier has 4 bays 422. Other numbers of bays may be used in the design of carrier chassis 410.

In other examples, the carrier chassis 410 may not have bays 422, and the processing components may be mounted on the carrier chassis 410 such that they protrude from the surface of the carrier chassis 410.

In at least one example, the carrier chassis 410 has a cavity for the borehole 412. The borehole 412 may be circular in shape, or it may be of other shapes, for example, elliptical, square, or hexagonal. The borehole 412 may be positioned in the center of the carrier chassis 410. The borehole 412 may also be positioned differently within the carrier chassis 410, such as offset to the side. The borehole 412 may also be positioned externally to the carrier chassis 410.

The electronics carrier 300 may include transmitter processing component 402, receiver processing component 404, and/or miscellaneous electronics 406. Various combinations of such electronics with at least one transmitter processing component 402 and one receiver processing component 404 may be used.

In some examples, such as the one shown in FIG. 6A, the electronics carrier 300 has a carrier chassis 410 with four bays 422. Placed in the bays 422 are transmitter processing component 402, receiver processing component 404, and miscellaneous electronics 406 in two of the bays 422. The transmitter processing component 402 has large current flowing through, creates a magnetic field, and induces current 414 flowing on the surface of the carrier chassis 410 and the inner diameter of the drill collar 408. An electromagnetic shield 416 is placed around the receiver processing component 404 to shield the receiver processing component 404 from the currents 414.

In some examples, such as the one shown in FIG. 6B, receiver processing component 404 may be placed in multiple bays, each with an electromagnetic shield 416 placed around it. In FIG. 6B, the electronics carrier 300 has a carrier chassis 410 with four bays 422. Placed in the bays 422 are transmitter processing component 402 and receiver processing component 404 in the other three bays. The transmitter processing component 402 has large current flowing through, creates a magnetic field, and induces current 414 flowing on the surface of the carrier chassis 410 and the inner diameter of the drill collar 408. An electromagnetic shield 416 is placed around the receiver processing component 404 in each of the bays to shield the receiver processing component 404 from the currents 414.

In some examples, there are multiple units of receiver processing component 404 placed on the carrier chassis 410. A single electromagnetic shield 416 may be placed around all units of receiver processing component 404 such that all units of receiver processing component 404 are shielded from currents 414.

In some examples, such as the one shown in FIG. 6C, an electromagnetic shield 418 may be placed around the transmitter processing component 402. In FIG. 6C, the electronics carrier 300 has a carrier chassis 410 with four bays 422. Placed in the bays 422 are transmitter processing component 402, receiver processing component 404, and miscellaneous electronics 406 in two of the bays. The transmitter processing component 402 has large current flowing through, creates a magnetic field, and induces current 415. An electromagnetic shield 418 is placed around the transmitter processing component 402, such that the induced current 415 circulates within the electromagnetic shield 418. In such examples, the induced current 415 does not flow on the electronics carrier 300 or the internal diameter of the drill collar 408, as the current 415 would when no electromagnetic shield 418 is placed around the transmitter processing component 402. As the transmitter processing component 402 may be larger in dimension than the receiver processing component 404, the electromagnetic shield 418 must be designed to fit in the limited space of the tool.

In some examples, the electromagnetic shield 416 and/or 418 for receiver processing component 404 and transmitter processing component 402, respectively, may be integrated into the design of the carrier chassis 410. The integration of the electromagnetic shield 416 and/or 418 into the carrier chassis 410 helps make space for the electromagnetic shield and the electronics in a confined space within the tool.

In other examples, electromagnetic shield 416 and/or 418 for receiver processing component 404 and transmitter processing component 402, respectively, may be detachable from the carrier chassis 410 to allow for flexible modifications and increased compatibility with models that do not have integrated electromagnetic shields.

Electromagnetic shields may also be used in other parts of a downhole tool. For example, electromagnetic shields may be used to cover electronics in components other than the electronics carrier that may be at risk for cross-talk, as well as wires and harnessing used in the tool. While the examples illustrated in FIGS. 5-6C illustrate the transmitter processing component 402 and the receiver processing component 404 circumferentially disposed on the same point along the longitudinal axis of the electronics carrier 300, one or more of the transmitter processing component 402 and/or the receiver processing component 404 may be disposed on a different point along the longitudinal axis of the electronics carrier 300.

Figure 7:
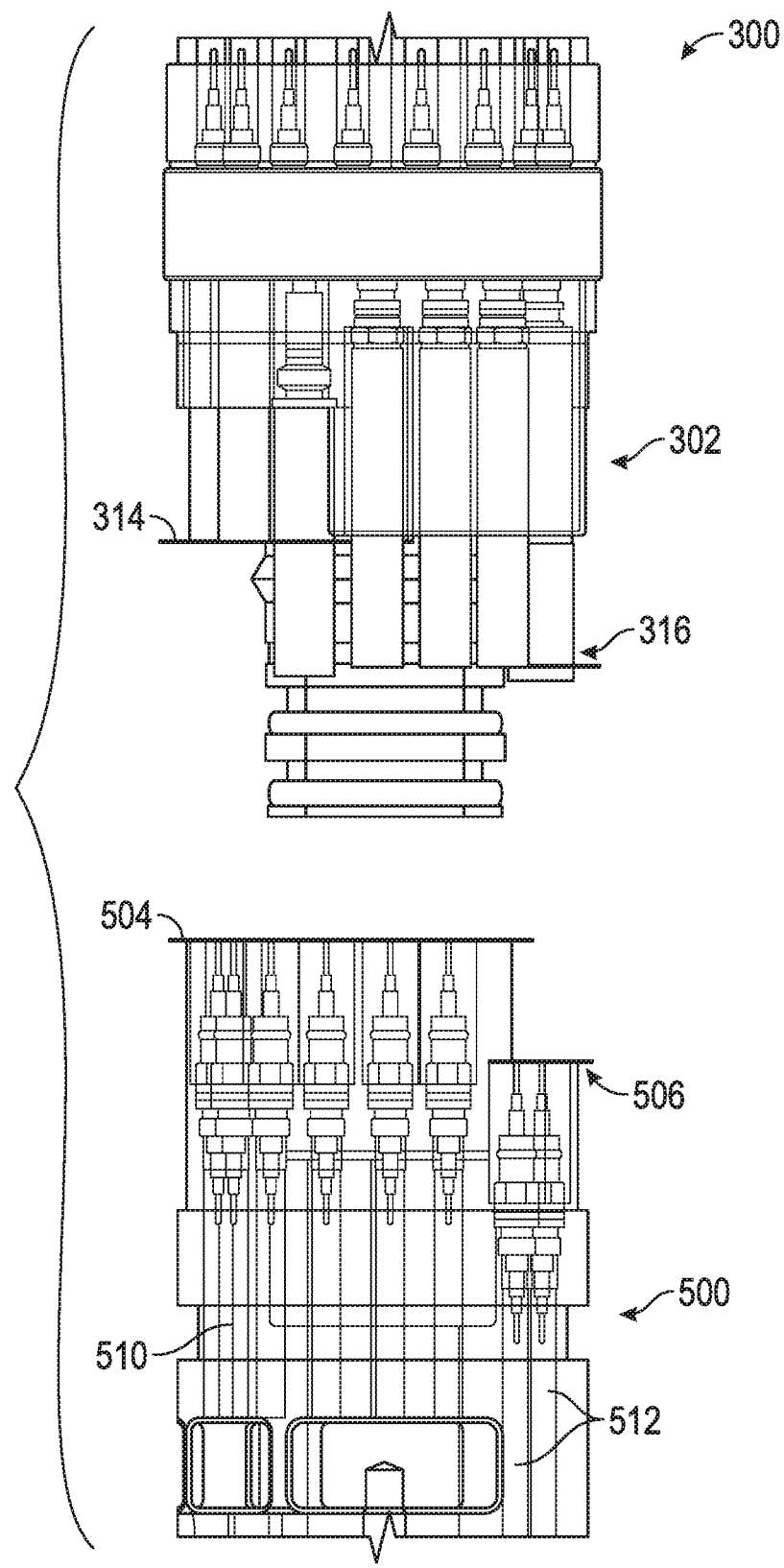
FIG. 7 is a diagram illustrating the coupling between a connector ring and an electronics carrier.

FIG. 7 is a diagram illustrating the coupling between a connector ring 500 and an electronics carrier 300. The connector ring 500 is used to communicatively and structurally couple the electronics carrier 300 with transmitter wires 510 and receiver wires 512. The connector ring 500 is coupled to an electronics carrier 300 by attaching the connecting portion 302 of the electronics carrier 300 to the connector ring 500. The connector ring 500 connects to one or more receiver antennas with receiver antenna wires 512, and to one or more transmitter antennas with transmitter antenna wires 510. Transmitter wires 510 and receiver wires 512 are used to connect to the respective antennas on the drill collar 408 in the downhole tool. The transmitter wires 510 and receiver wires 512 have to all pass through the single connector ring 500 that couples with the electronics carrier 300. In the connector ring 500, transmitter wires 510 and receiver wires 512 may be spliced to the antenna feed wires. In some examples, there can be at least one cavity 502 for splicing transmitter wires 510 and at least one cavity 502 for splicing receiver wires 512. The cavities 502 for transmitter wires 510 and for receiver wires 512 are at close proximity and thus have a high risk of cross-talk.

Figure 8A:
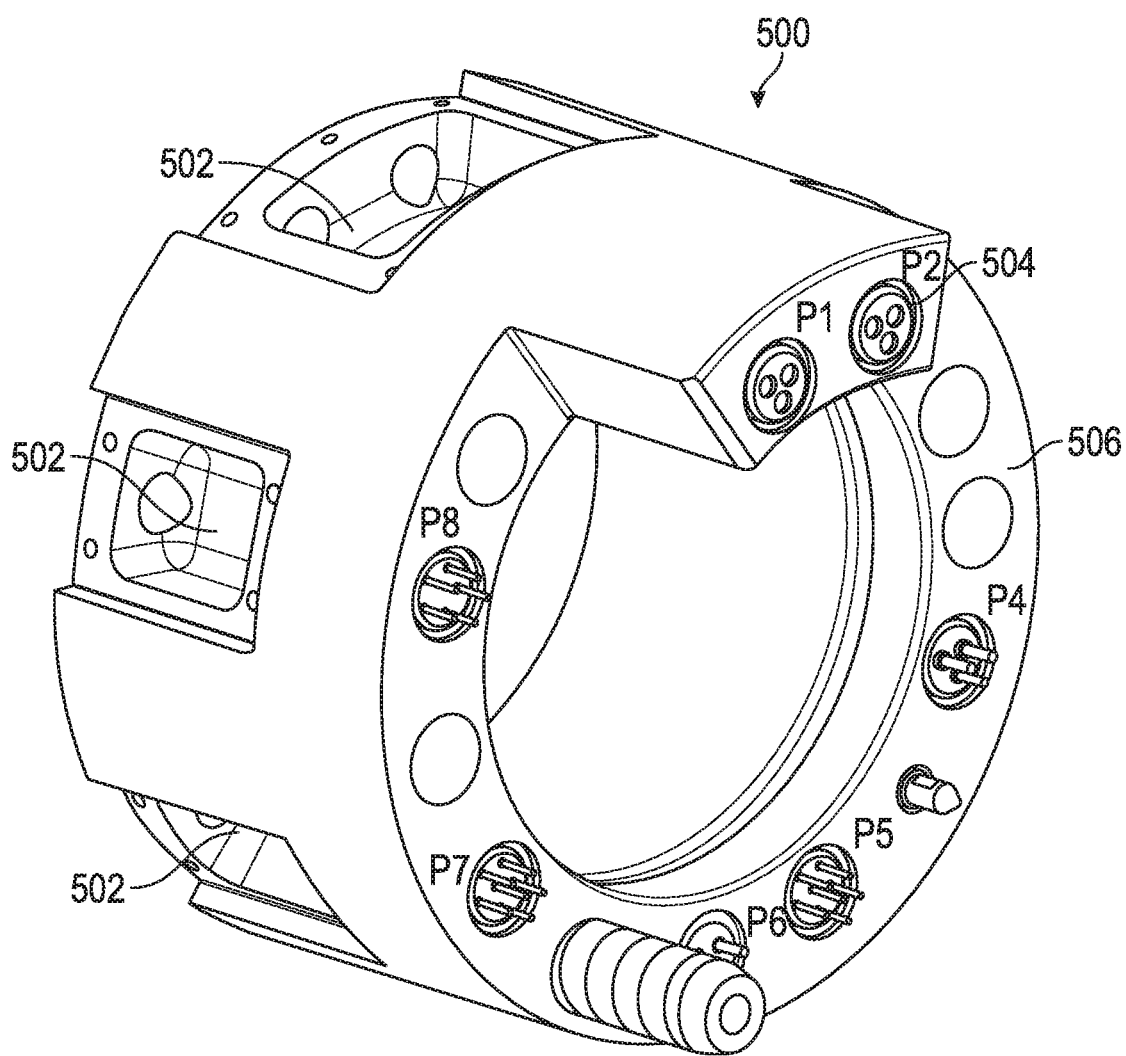
FIG. 8A is a diagram illustrating an exemplary staggered connector ring with uncovered wiring cavities.
Figure 8B:
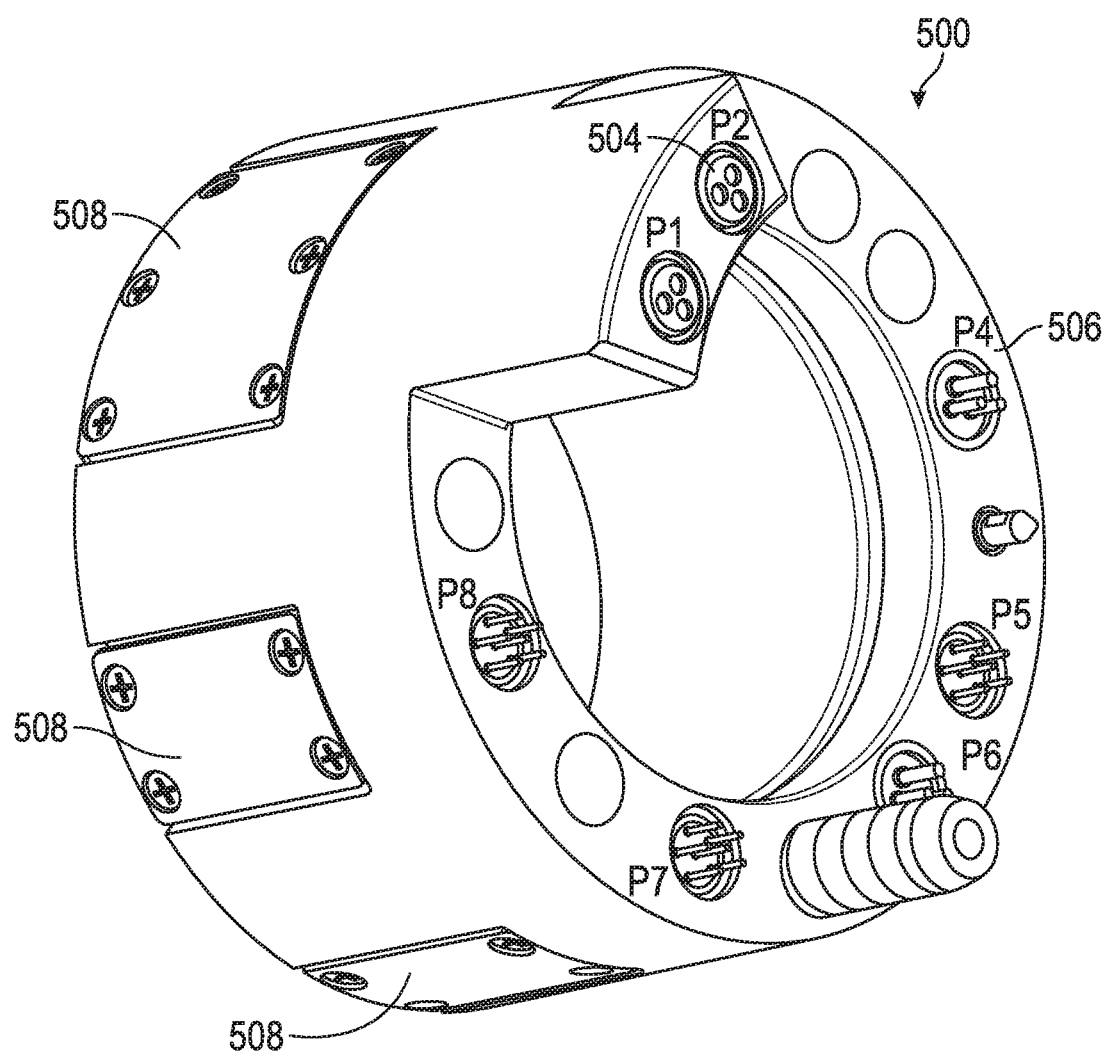
FIG. 8B is a diagram illustrating a staggered connector ring with covered wiring cavities according to the present disclosure.

FIG. 8A illustrates an example connector ring 500 with cavities 502, which may be used in the downhole tool. FIG. 8B shows an example of how electromagnetic shields 508 may be used to cover the cavities 502 to prevent cross-talk. The electromagnetic shields 508 may be constructed using aluminum, copper, or any other conductive materials. In at least one example, the electromagnetic shields 508 can be at least as thick as one skin depth of the lowest frequency emitted by transmitter wires 510. In other examples, if space permits, the electromagnetic shields 508 can have a thickness of 2 or 3 skin depths. In yet other examples, the thickness of the electromagnetic shields 508 can be any desired thickness.

In at least one example, the connector ring 500 is staggered such that there is a transmitter shoulder 504 that connects to the transmitter wires 510, and a receiver shoulder 506 that connects to the receiver wires 512. In the example shown in FIG. 8A, the transmitter shoulder 504 extends further than the receiver shoulder 506. However, other examples may include a receiver shoulder 506 that extends further than the transmitter shoulder 504. The staggering of the transmitter shoulder 504 and the receiver shoulder 506 is used to prevent crosstalk between the transmitter wires 510 and receiver wires 512. In the examples that have staggered connector rings, the connecting portion 302 of the electronics carrier 300 is staggered in a corresponding way to have a carrier transmitter shoulder 314 and a carrier receiver shoulder 316. In other examples, the transmitter shoulder 504 and the receiver shoulder 506 may not be staggered.

In some examples, the electromagnetic shields 508 may be solid to maximize shielding against undesired electromagnetic signals.

In some examples, the electromagnetic shields 508 may have perforations, the perforations being smaller, and in some cases significantly smaller, in dimension than the wavelength of the highest frequency transmitter signal.

In some examples, the electromagnetic shields 508 may include wire meshes that are able to conform to the geometry of the space. In such examples, the spacing between each two adjacent wire in the wire mesh is smaller, and in some cases significantly smaller, in dimension than the wavelength of the highest frequency transmitter signal.

In at least one example, gaskets 202 as shown in FIG. 3 are used at the junctions between the electromagnetic shields 508 and cavities 502. The gaskets are used to seal any gap at the junctions, and may be manufactured with aluminum, copper, beryllium copper, brass, stainless steel, or any other pliable conductive material that may be used to form a seal.

In some examples, the connector ring 500 does not have cavities, and the transmitter wires 510 and receiver wires 512 are spliced to the antenna feed wires in a manner that protrudes from the surface of the connector ring 500. In such examples, electromagnetic shields 508 may be placed around the spliced wires in a cage like manner to reduce cross-talk.

Figure 9:
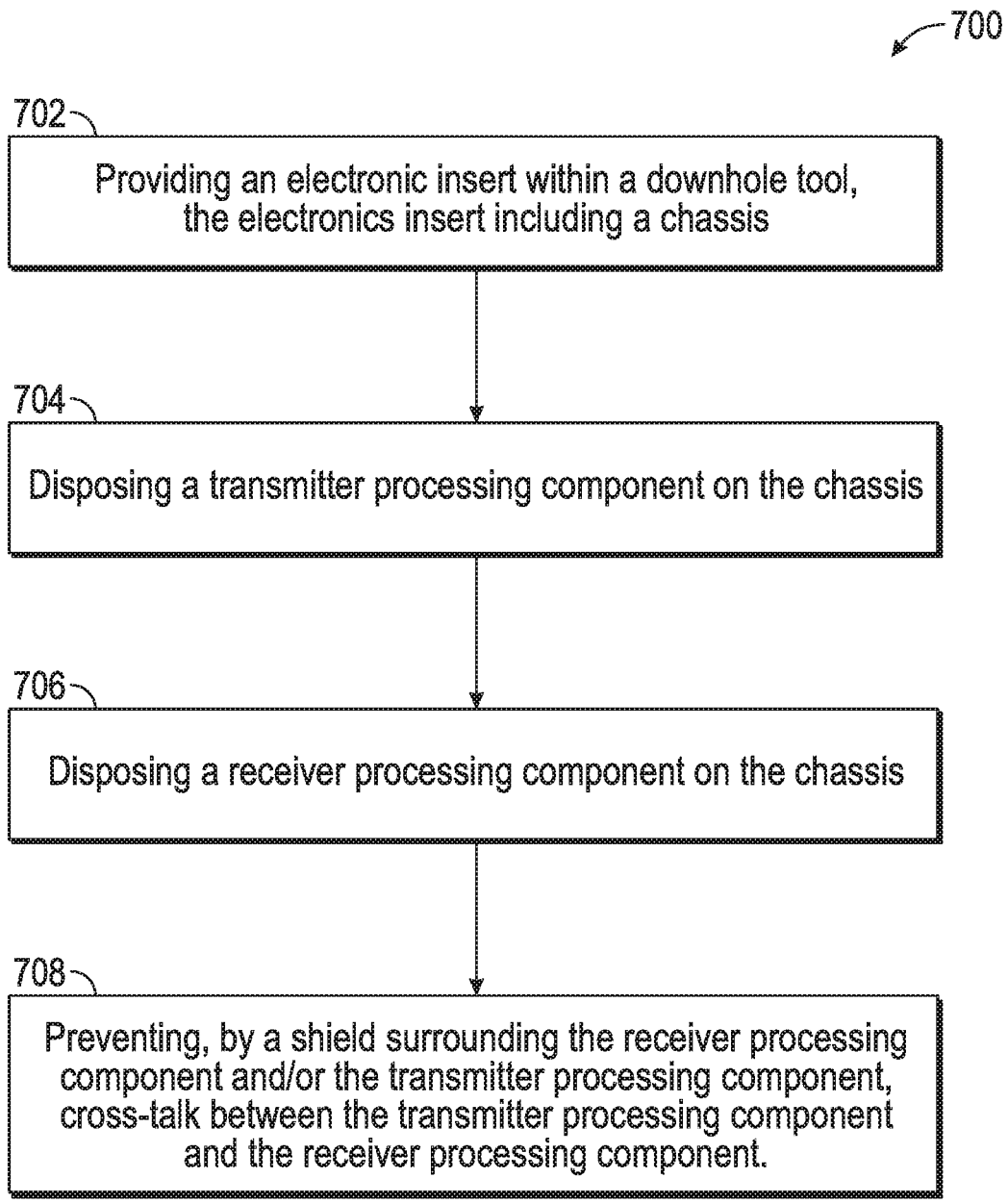
FIG. 9 is a flow chart of a method for utilizing a shield according to the present disclosure.

Referring to FIG. 9, a flowchart is presented in accordance with an example embodiment. The method 700 is provided by way of example, as there are a variety of ways to carry out the method. The method 700 described below can be carried out using the configurations illustrated in FIGS. 1-8B, for example, and various elements of these figures are referenced in explaining example method 700. Each block shown in FIG. 9 represents one or more processes, methods or subroutines, carried out in the example method 700. Furthermore, the illustrated order of blocks is illustrative only and the order of the blocks can change according to the present disclosure. Additional blocks may be added or fewer blocks may be utilized, without departing from this disclosure.

The example method 700 can begin at block 702. At block 702, an electronics carrier is disposed in a downhole tool, the electronics carrier including a chassis. Next, at block 704, a transmitter processing component is disposed on the chassis of the electronics carrier. At block 706, a receiver processing component is disposed on the chassis of the electronics carrier. Additionally, at block 708, a shield surrounds the receiver processing component and/or the transmitter processing component to prevent crosstalk between the transmitter processing component and the receiver processing component, wherein the shield surrounds at least a portion of one of the receiver processing component and the transmitter processing component.

Figure 10A:
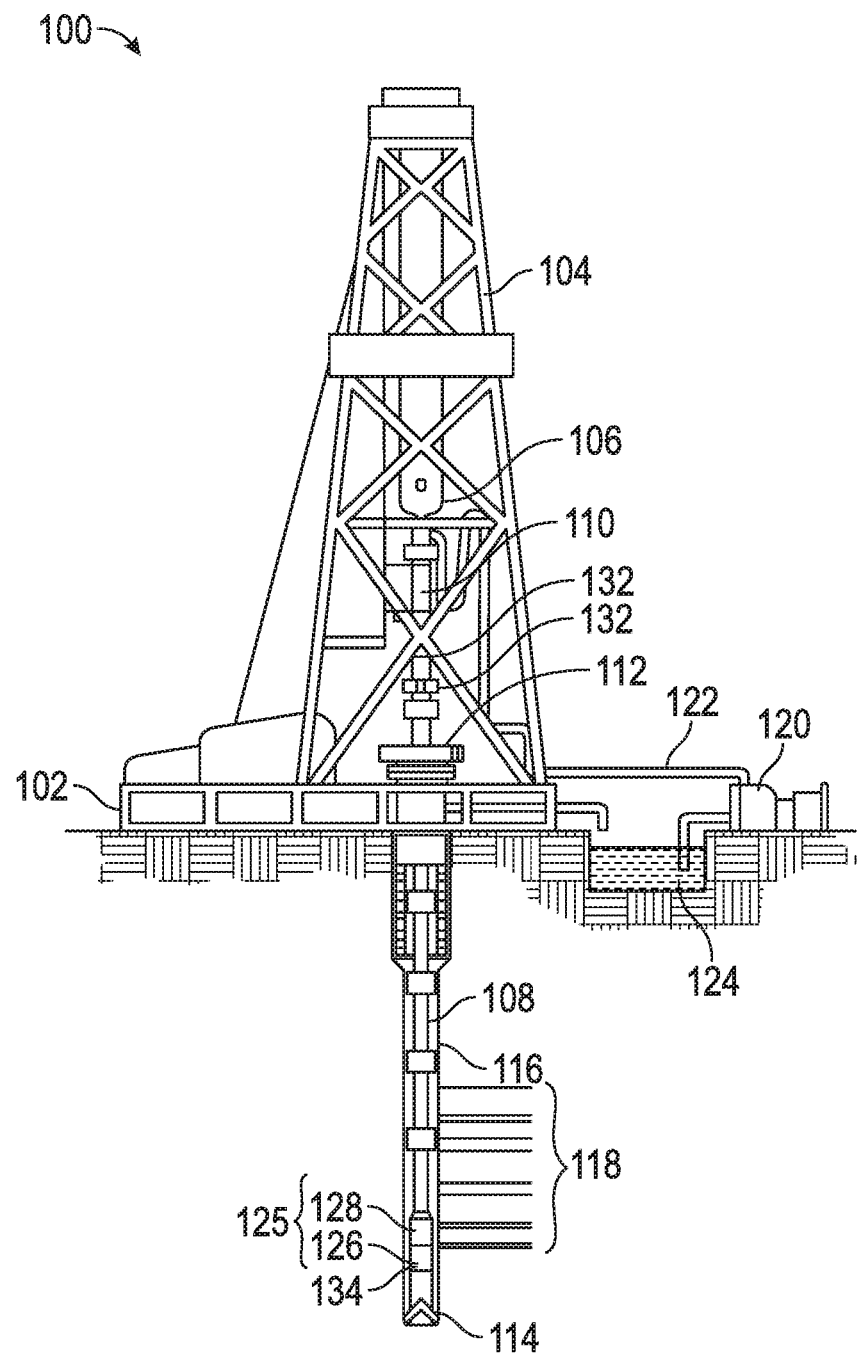
FIG. 10A is a diagram illustrating an exemplary environment for a downhole tool with an electronics carrier and/or a connector ring according to the present disclosure.

The downhole tool can be employed in an exemplary wellbore operating environment 100 shown, for example, in FIG. 10A. FIG. 10A illustrates a schematic view of a wellbore operating environment 100 in accordance with some examples of the present disclosure. As depicted in FIG. 10A, a drilling platform 102 can be equipped with a derrick 104 that supports a hoist 106 for raising and lowering a drill string 108. The hoist 106 suspends a top drive 110 suitable for rotating and lowering the drill string 108 through a well head 112. A drill bit 114 can be connected to the lower end of the drill string 108. As the drill bit 114 rotates, the drill bit 114 creates a wellbore 116 that passes through various subterranean formations 118. A pump 120 circulates drilling fluid through a supply pipe 122 to top drive 110, down through the interior of drill string 108 and orifices in drill bit 114, back to the surface via the annulus around drill string 108, and into a retention pit 124. The drilling fluid transports cuttings from the wellbore 116 into the retention pit 124 and aids in maintaining the integrity of the wellbore 116. Various materials can be used for drilling fluid, including oil-based fluids and water-based fluids.

The drill string 108 may include downhole tool. For instance, logging tools 126, which may be or include a downhole tool, can be integrated into the bottom-hole assembly 125 near the drill bit 114 for carrying out measure while drilling (MWD) or logging while drilling (LWD) operations. As the drill bit 114 extends the wellbore 116 through the formations 118, logging tools 126 collect measurements relating to various formation properties as well as the orientation of the tool and various other drilling conditions. The bottom-hole assembly 125 may also include a telemetry sub 128 to transfer measurement data to a surface receiver 132 and to receive commands from the surface. In at least some cases, the telemetry sub 128 communicates with a surface receiver 132 using mud pulse telemetry. In some instances, the telemetry sub 128 does not communicate with the surface, but rather stores logging data for later retrieval at the surface when the logging assembly is recovered.

Each of the logging tools 126 may include one or more tool components spaced apart from each other and communicatively coupled by one or more wires and/or other media. The logging tools 126 may also include one or more computing devices 134 communicatively coupled with one or more of the tool components by one or more wires and/or other media. The one or more computing devices 134 may be configured to control or monitor a performance of the tool, process logging data, and/or carry out one or more aspects of the methods and processes of the present disclosure.

In at least one example, one or more of the logging tools 126 may communicate with a surface receiver 132 by a wire, such as wired drillpipe. In other cases, the one or more of the logging tools 126 may communicate with a surface receiver 132 by wireless signal transmission. In at least some cases, one or more of the logging tools 126 may receive electrical power from a wire that extends to the surface, including wires extending through a wired drillpipe.

Figure 10B:
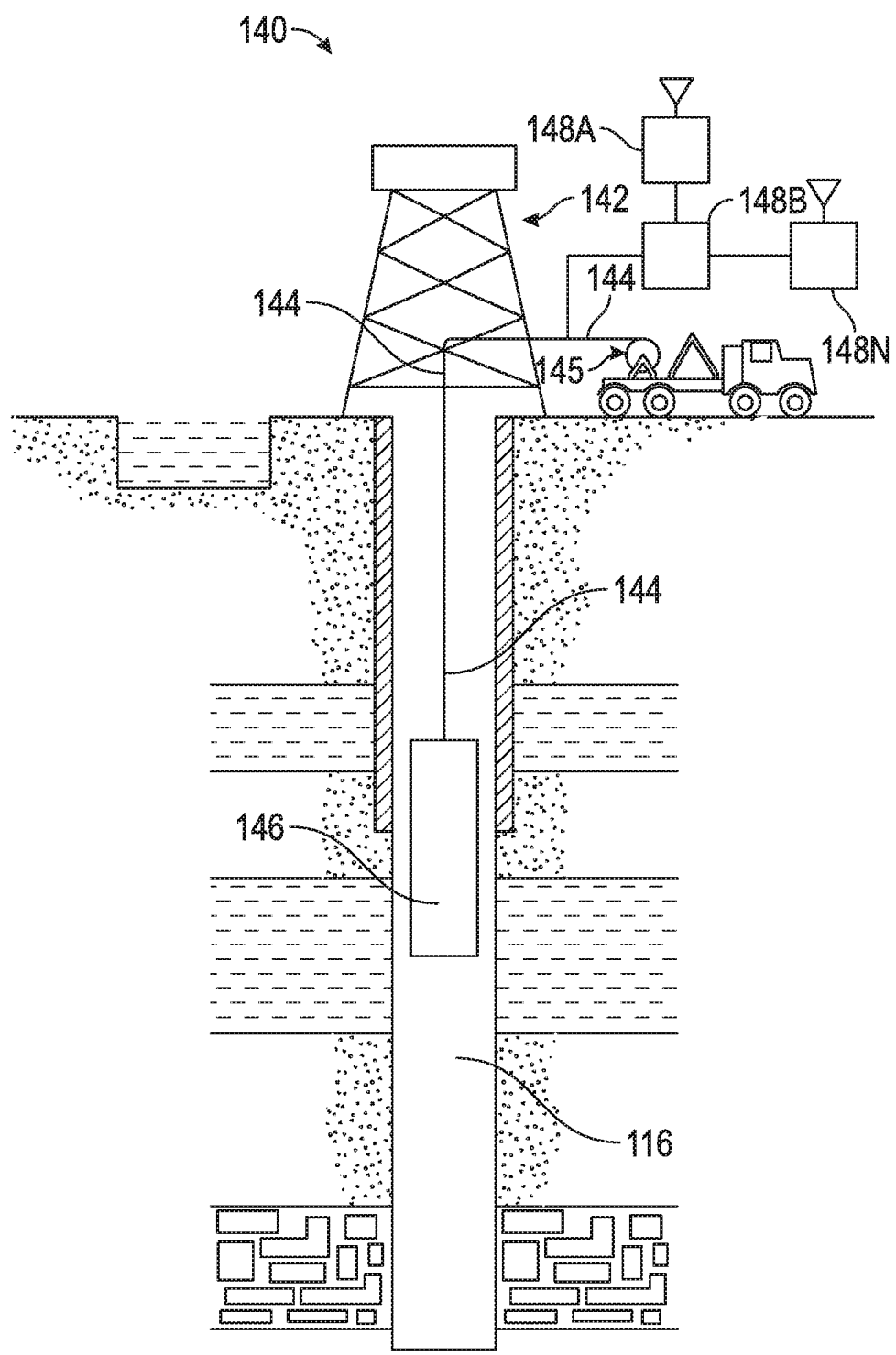
FIG. 10B is a diagram illustrating another exemplary environment for a downhole tool with an electronics carrier and/or a connector ring according to the present disclosure.

Referring to FIG. 10B, an example system 140 for downhole line detection in a downhole environment can employ a tool having a tool body 146 in order to carry out logging and/or other operations. The tool body 146 may be or include a downhole tool. In this environment, rather than using a drill string 108 of FIG. 10A to lower tool body 146 and which can contain sensors and/or other instrumentation for detecting and logging nearby characteristics and conditions of the wellbore 116 and surrounding formations, the drill string can be a wireline conduit 144. The tool body 146 can include a resistivity logging tool. The tool body 146 can be lowered into the wellbore 116 by wireline conduit 144. The wireline conduit 144 can be anchored in the drill rig 145 or by a portable means such as a truck. The wireline conduit 144 can include one or more wires, slicklines, cables, and/or the like, as well as tubular conduits such as coiled tubing, joint tubing, or other tubulars.

The illustrated conduit 144 provides power and support for the tool, as well as enabling communication between tool processors 148A-N on the surface. In some examples, the wireline conduit 144 can include electrical and/or fiber optic cabling for carrying out communications. The wireline conduit 144 is sufficiently strong and flexible to tether the tool body 146 through the wellbore 116, while also permitting communication through the wireline conduit 144 to one or more processors 148A-N, which can include local and/or remote processors. Moreover, power can be supplied via the wireline conduit 144 to meet power requirements of the tool. For slickline or coiled tubing configurations, power can be supplied downhole with a battery or via a downhole generator.

It should be noted that while FIGS. 10A and 10B generally depict a land-based operation, those skilled in the art would readily recognize that the principles described herein are equally applicable to operations that employ floating or sea-based platforms and rigs, without departing from the scope of the disclosure. Also, even though FIGS. 10A and 10B depict a vertical wellbore, the present disclosure is equally well-suited for use in wellbores having other orientations, including horizontal wellbores, slanted wellbores, multilateral wellbores or the like.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the examples described above may be modified within the scope of the appended claims.

Numerous examples are provided herein to enhance understanding of the present disclosure. A specific set of statements are provided as follows.

Statement 1: An electronics carrier to be disposed in a downhole tool is disclosed, the electronics carrier comprising: a chassis; a receiver processing component disposed on the chassis, the receiver processing component to communicatively couple to one or more receiver sensors; a transmitter processing component disposed on the chassis, the transmitter processing component to communicatively couple to one or more transmitter sensors; and a shield surrounding the receiver processing component and/or the transmitter processing component to prevent cross-talk between the transmitter processing component and the receiver processing component.

Statement 2: An electronics carrier is disclosed according to Statement 1, wherein the receiver processing component includes a receiver pre-amplifier, wherein the shield surrounds the receiver pre-amplifier.

Statement 3: An electronics carrier is disclosed according to Statements 1 or 2, wherein the chassis forms a transmitter cavity to receive the transmitter processing component and a receiver cavity to receive the receiver processing component.

Statement 4: An electronics carrier is disclosed according to Statement 3, wherein the shield encloses the transmitter cavity and/or the receiver cavity.

Statement 5: An electronics carrier is disclosed according to any of preceding Statements 1-4, wherein the shield includes: a housing to receive at least a portion of one of the receiver processing component and the transmitter component; and a cover to mate with the housing, wherein the housing and the cover together completely surround the at least a portion of one of the receiver processing component and the transmitter component.

Statement 6: An electronics carrier is disclosed according to Statement 5, wherein the shield further includes: a gasket disposed between the mating of the cover and the housing, the gasket forming a seal between the cover and the housing.

Statement 7: An electronics carrier is disclosed according to Statement 6, wherein the gasket is made of at least one of aluminum, copper, beryllium copper, brass, stainless steel.

Statement 8: An electronics carrier is disclosed according to any of preceding Statements 1-7, wherein the chassis is connected to the shield as a ground.

Statement 9: A system is disclosed comprising: a downhole tool disposed in a wellbore, the downhole tool including: a receiver sensor; a transmitter sensor; an electronics carrier disposed in the downhole tool, the electronics carrier including: a chassis; a receiver processing component disposed on the chassis, the receiver processing component to communicatively couple to the receiver sensor; a transmitter processing component disposed on the chassis, the transmitter processing component to communicatively couple to the transmitter sensor; a shield surrounding the receiver processing component and/or the transmitter processing component to prevent cross-talk between the transmitter processing component and the receiver processing component.

Statement 10: A system is disclosed according to Statement 9, wherein the receiver processing component includes a receiver pre-amplifier, wherein the shield surrounds the receiver pre-amplifier.

Statement 11: A system is disclosed according to Statements 9 or 10, wherein the chassis forms a transmitter cavity to receive the transmitter processing component and a receiver cavity to receive the receiver processing component.

Statement 12: A system is disclosed according to Statement 11, wherein the shield encloses the transmitter cavity and/or the receiver cavity.

Statement 13: A system is disclosed according to any of preceding Statements 9-12, wherein the shield includes: a housing to receive at least a portion of one of the receiver processing component and the transmitter component; and a cover to mate with the housing, wherein the housing and the cover together completely surround the at least a portion of one of the receiver processing component and the transmitter component.

Statement 14: A system is disclosed according to Statement 13, wherein the shield further includes: a gasket disposed between the mating of the cover and the housing, the gasket forming a seal between the cover and the housing.

Statement 15: A system is disclosed according to Statement 14, wherein the gasket is made of at least one of aluminum, copper, beryllium copper, brass, stainless steel.

Statement 16: A system is disclosed according to any of preceding Statements 9-15, wherein the chassis is connected to the shield as a ground.

Statement 17: A system is disclosed according to any of preceding Statements 9-16, wherein the electronics carrier includes a connecting portion to couple with a connector ring, wherein the connector ring includes a receiver antenna cavity and a transmitter antenna cavity, wherein the receiver sensor is communicatively coupled with the receiver processing component by a receiver antenna cable which passes through the receiver antenna cavity, wherein the transmitter sensor is communicatively coupled with the transmitter processing component by a transmitter antenna cable which passes through the transmitter antenna cavity, wherein wiring shields surround the receiver antenna cable in the receiver antenna cavity and the transmitter antenna cable in the transmitter antenna cavity.

Statement 18: A method is disclosed comprising: providing an electronics carrier within a downhole tool, the electronics carrier including a chassis; disposing a transmitter processing component on the chassis; disposing a receiver processing component on the chassis; preventing, by a shield surrounding the receiver processing component and/or the transmitter processing component, cross-talk between the transmitter processing component and the receiver processing component.

Statement 19: A method is disclosed according to Statement 18, wherein the chassis forms a transmitter cavity to receive the transmitter processing component and a receiver cavity to receive the receiver processing component, wherein the shield encloses the transmitter cavity and/or the receiver cavity.

Statement 20: A method is disclosed according to Statements 18 or 19, wherein the receiver processing component includes a receiver pre-amplifier, wherein the shield surrounds the receiver pre-amplifier.

The invention claimed is:

1. An electronics carrier to be disposed in a downhole tool, the electronics carrier comprising:
   a chassis;
   a receiver processing component disposed on the chassis, the receiver processing component to communicatively couple to one or more receiver sensors;
   a transmitter processing component disposed on the chassis, the transmitter processing component to communicatively couple to one or more transmitter sensors; and
   a shield surrounding the receiver processing component and/or the transmitter processing component to prevent cross-talk between the transmitter processing component and the receiver processing component,
   wherein the chassis forms a transmitter cavity to receive the transmitter processing component and a receiver cavity to receive the receiver processing component,
   wherein the shield encloses the transmitter cavity and/or the receiver cavity.

2. The electronics carrier of claim 1, wherein the receiver processing component includes a receiver pre-amplifier, wherein the shield surrounds the receiver pre-amplifier.

3. The electronics carrier of claim 1, wherein the shield includes:
   a housing receiving at least a portion of one of the receiver processing component and the transmitter component; and
   a cover to mate with the housing,
   wherein the housing and the cover together completely surround the at least a portion of one of the receiver processing component and the transmitter component.

4. The electronics carrier of claim 3, wherein the shield further includes:
   a gasket disposed between the mating of the cover and the housing, the gasket forming a seal between the cover and the housing.

5. The electronics carrier of claim 4, wherein the gasket is made of at least one of aluminum, copper, beryllium copper, brass, stainless steel.

6. The electronics carrier of claim 1, wherein the chassis is connected to the shield as a ground.

7. A system comprising:
   a downhole tool disposed in a wellbore, the downhole tool including:
      a receiver sensor;
      a transmitter sensor;
      an electronics carrier disposed in the downhole tool, the electronics carrier including:
         a chassis;
         a receiver processing component disposed on the chassis, the receiver processing component to communicatively couple to the receiver sensor;
         a transmitter processing component disposed on the chassis, the transmitter processing component to communicatively couple to the transmitter sensor;
         a shield surrounding the receiver processing component and/or the transmitter processing component to prevent cross-talk between the transmitter processing component and the receiver processing component,
         wherein the chassis forms a transmitter cavity to receive the transmitter processing component and a receiver cavity to receive the receiver processing component,
         wherein the shield encloses the transmitter cavity and/or the receiver cavity.

8. The system of claim 7, wherein the receiver processing component includes a receiver pre-amplifier, wherein the shield surrounds the receiver pre-amplifier.

9. The system of claim 7, wherein the shield includes:
   a housing to receive at least a portion of one of the receiver processing component and the transmitter component; and
   a cover to mate with the housing,
   wherein the housing and the cover together completely surround the at least a portion of one of the receiver processing component and the transmitter component.

10. The system of claim 9, wherein the shield further includes:
    a gasket disposed between the mating of the cover and the housing, the gasket forming a seal between the cover and the housing.

11. The system of claim 10, wherein the gasket is made of at least one of aluminum, copper, beryllium copper, brass, stainless steel.

12. The system of claim 7, wherein the chassis is connected to the shield as a ground.

13. The system of claim 7, wherein the electronics carrier includes a connecting portion to couple with a connector ring,
    wherein the connector ring includes a receiver antenna cavity and a transmitter antenna cavity,
    wherein the receiver sensor is communicatively coupled with the receiver processing component by a receiver antenna cable which passes through the receiver antenna cavity,
    wherein the transmitter sensor is communicatively coupled with the transmitter processing component by a transmitter antenna cable which passes through the transmitter antenna cavity,
    wherein wiring shields surround the receiver antenna cable in the receiver antenna cavity and the transmitter antenna cable in the transmitter antenna cavity.

14. A method comprising:
    providing an electronics carrier within a downhole tool, the electronics carrier including a chassis;
    disposing a transmitter processing component on the chassis;
    disposing a receiver processing component on the chassis;
    preventing, by a shield surrounding the receiver processing component and/or the transmitter processing component, cross-talk between the transmitter processing component and the receiver processing component,
    wherein the chassis forms a transmitter cavity to receive the transmitter processing component and a receiver cavity to receive the receiver processing component,
    wherein the shield encloses the transmitter cavity and/or the receiver cavity.

15. The method of claim 14, wherein the receiver processing component includes a receiver pre-amplifier, wherein the shield surrounds the receiver pre-amplifier.

* * * * *